US008324784B2

(12) United States Patent
Engel et al.

(10) Patent No.: US 8,324,784 B2
(45) Date of Patent: Dec. 4, 2012

(54) METHOD FOR TUNING A RESONANT FREQUENCY OF A PIEZOELECTRIC COMPONENT

(75) Inventors: Guenter Engel, Leibnitz (AT); Michael Huainig, Graz (AT); Markus Puff, Graz (AT); Thomas Wippel, Stainz (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/970,633

(22) Filed: Dec. 16, 2010

(65) Prior Publication Data

US 2011/0169374 A1     Jul. 14, 2011

Related U.S. Application Data

(63) Continuation of application No. PCT/EP2009/057377, filed on Jun. 15, 2009.

(30) Foreign Application Priority Data

Jun. 18, 2008   (DE) .................. 10 2008 028 885

(51) Int. Cl.
*H01L 41/08* (2006.01)

(52) U.S. Cl. ................... 310/319; 310/311; 310/321

(58) Field of Classification Search ............ 310/316.01, 310/316.02, 317, 319
See application file for complete search history.

(56) References Cited

U.S. PATENT DOCUMENTS

| | | | | |
|---|---|---|---|---|
| 4,237,399 A | * | 12/1980 | Sakamoto | .................. 310/317 |
| 4,401,956 A | * | 8/1983 | Joshi | .......................... 333/152 |
| 5,410,205 A | * | 4/1995 | Gururaja | ..................... 310/328 |
| 5,446,306 A | | 8/1995 | Stokes et al. | |
| 6,346,764 B1 | | 2/2002 | Boyd | |
| 6,534,900 B2 | | 3/2003 | Aigner et al. | |
| 6,940,209 B2 | | 9/2005 | Henderson | |
| 2008/0129416 A1 | | 6/2008 | Volatier et al. | |

FOREIGN PATENT DOCUMENTS

| | | |
|---|---|---|
| DE | 100 07 577 C1 | 9/2001 |
| EP | 1 126 602 A2 | 8/2001 |
| WO | WO 2006/138091 A1 | 12/2006 |
| WO | WO 2007/055808 A2 | 5/2007 |
| WO | WO 2008/090095 A1 | 7/2008 |

OTHER PUBLICATIONS

Cady, W. G., "An Introduction to the Theory and Applications of Electromechanical Phenomena in Crystals," Piezoelectricity, Vibrations of Crystals, 1946, pp. 83-115, vol. 1, Dover Publications, Inc., New York.

* cited by examiner

*Primary Examiner* — Mark Budd
(74) *Attorney, Agent, or Firm* — Slater & Matsil, L.L.P.

(57) ABSTRACT

A method for tuning a resonant frequency of a piezoelectric component is disclosed. The piezoelectric component includes a transducer extending in three spatial directions. The resonant frequency depends on an extension in at least one of the spatial directions and/or on a material-dependent elasticity modulus. The transducer includes a layered structure with at least two first electrodes and at least one second electrode, which is disposed between the two first electrodes. In the method, a DC voltage is applied to at least one of the at least two first electrodes and the at least one second electrode, so that a change of the resonant frequency results due to a change to the extension in the one spatial direction and the elasticity modulus. A control voltage with an excitation frequency is applied, the excitation frequency substantially corresponding to the modified resonant frequency. This generates a vibration of the piezoelectric component.

11 Claims, 5 Drawing Sheets

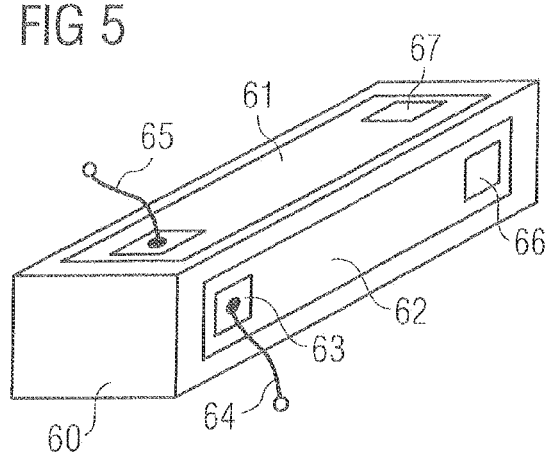
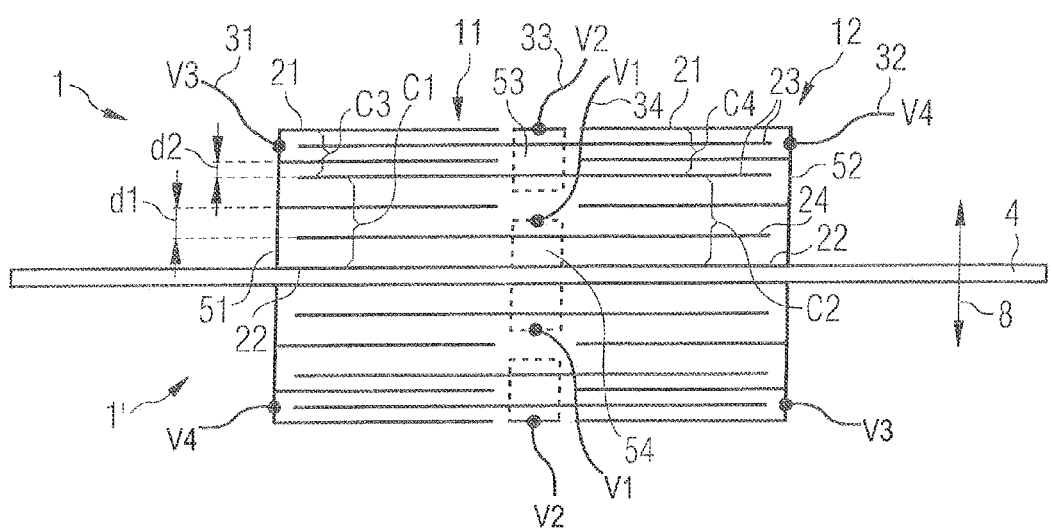

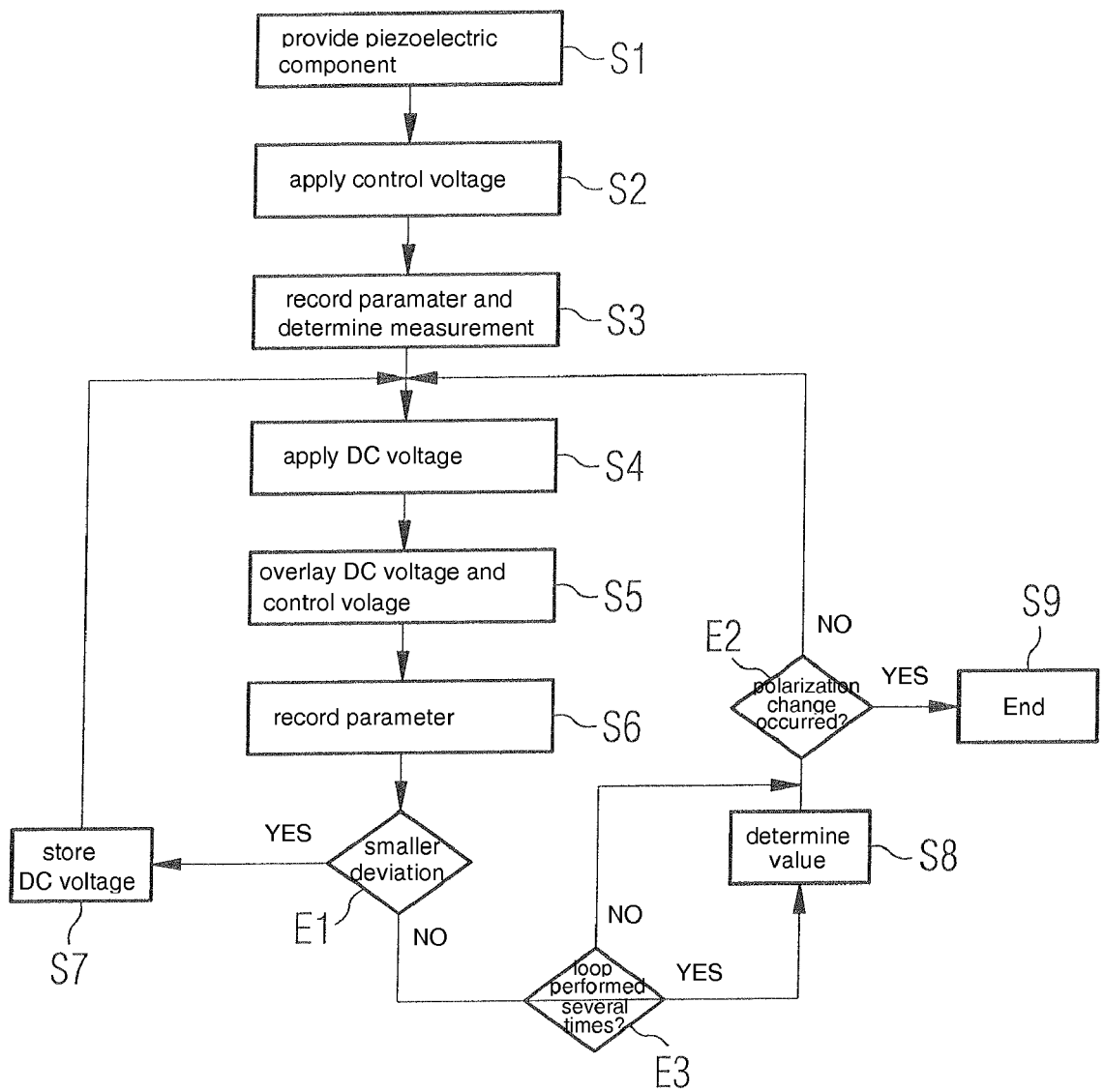

METHOD FOR TUNING A RESONANT FREQUENCY OF A PIEZOELECTRIC COMPONENT

This application is a continuation of co-pending International Application No. PCT/EP2009/057377, filed Jun. 15, 2009, which designated the United States and was not published in English, and which claims priority to German Application No. 10 2008 028 885.3, filed Jun. 18, 2008, both of which applications are incorporated herein by reference.

TECHNICAL FIELD

The invention relates to a method for tuning a resonant frequency of a piezoelectric component.

BACKGROUND

A piezoelectric component is known, for example, from the document U.S. Pat. No. 6,346,764.

Such piezoelectric components are used in a number of applications. One typical application is actuators, in which vibrations, for example, flexural vibrations, or stretching vibrations are induced in a piezoelectric component by a control voltage. A natural resonant frequency of the piezoelectric component results from the geometric dimensions of the component in combination with elastic properties, which characterize the response to the supplied excitation. In order to keep the damping to a minimum during excitation, it is expedient to construct the piezoelectric component so that its natural resonant frequency corresponds to the desired excitation frequency.

SUMMARY

In one aspect, the present invention provides a technique to tune piezoelectric components as well as a vibration-capable component arrangement having a piezoelectric component, with respect to their resonant frequency.

In one embodiment, the piezoelectric component includes at least one transducer that extends in three spatial directions, wherein the resonant frequency of the transducer and therefore also of the component depends on an extension in at least one of the spatial directions and/or on a material dependent elastic property. The transducer comprises a layered structure with at least two first electrodes and at least one second electrode. The latter is disposed between the at least two first electrodes. In one embodiment, the transducer thus comprises a plurality of electrodes that are stacked alternating on top of one another.

According to the proposed principle, a DC voltage is now applied to at least one of the at least two first electrodes and the at least one second electrode. A change in the resonant frequency is induced thereby, because the applied DC voltage induces a change of the extension of the transducer in at least one of the three spatial directions and/or induces a change of the elastic property. Also, the control voltage with an excitation frequency is applied that essentially corresponds to the changed resonant frequency for exciting a vibration.

A modification or tuning of the resonant frequency of the piezoelectric component therefore occurs by changing its geometric dimensions or at least one component of the elastic property by applying a DC voltage.

In this manner, various piezoelectric components with transducers of slightly different dimensions can be tuned to one another with respect to their natural resonant frequency. This is performed by applying different DC voltages to at least one of the at least two first electrodes and the at least one second electrode of each transducer. The applied DC voltage leads to a change of the geometric dimensions of the transducer or to one or more components of the elastic property. The resonant frequency, which depends on the elastic property and on at least one spatial direction, thereby changes. Therefore, by applying a suitable DC voltage, the resonant frequency of different piezoelectric components can be tuned to one another.

The elastic property can be derived from an elasticity modulus and/or one or more components thereof.

In a second step, a control voltage with an excitation frequency is now applied to the electrodes of the piezoelectric components, wherein the excitation frequency of the control voltage corresponds substantially to the changed resonant frequency. The control voltage is essentially an AC voltage.

As a result, the resonant frequencies of different piezoelectric components are tuned to one another, without requiring mechanical change to the geometry of the components, for example, their outer dimensions. In particular, resonant frequencies of piezoelectric components which have manufacturing-related variations of the geometric dimensions can be tuned to one another without mechanical processing, or can be reversibly adjusted to a predefined value. Therefore, manufacturing costs, in particular, for precisely adjusting the frequency of the resonant frequencies by appropriate machining can be omitted. Furthermore, it is possible to compensate for changes in the resonant frequency of components caused by external parameters that cannot be influenced. For example, a temperature compensation of the resonant frequency of the piezoelectric component can be performed by means of the proposed method.

Tuning with a DC voltage is also possible because the stated mechanical capacitance equivalence codetermines the resonant frequency of the component, and simultaneously depends on the voltage. From the energy point of view, upon application of an electric field, the component attempts to attain a most favorable, that is, low energy state. The applied DC voltage correspondingly generates an electric vector field which acts on the component and the piezoelectric material. In response to the field, the component changes its geometric dimensions in one or more spatial directions and/or one or more components of the elasticity modulus. Naturally, the change depends on the direction of the field.

In one preferred embodiment the extended transducer has a multilayered structure in which a plurality of electrodes is disposed one above the other. This permits lower voltages in order to attain the same field strengths in the piezoelectric layers.

In one embodiment the at least two first electrodes comprise at least a third and a fourth electrode, and the at least one second electrode comprises at least a fifth and a sixth electrode. The fifth electrode is disposed between the third and fourth electrode, and the second electrode is disposed between the fifth and sixth electrode. The electrodes are designed so that the same voltage is applied between the fifth and the sixth electrode.

In one alternative embodiment, the DC voltage as well as the control voltage is applied at the same electrodes respectively. Here, the at least two first electrodes can be connected to each other. By an appropriate embodiment of the transducer, including also by a suitable selection of the material, the number and layer thickness of the individual piezoelectric layers, as well as the lateral dimension of the transducer, a conversion of the electrical energy can be performed preferably at a location where the excitation of mechanical vibrations is desired.

PZT ceramics of any composition, but also other suitable piezoelectric ceramics with low loss angles, can be considered for piezoelectric layers. The individual ceramic layers between the electrodes can have the same layer thickness and the same distance from each other. However, it is also possible to use different layer thickness distances or other materials in order to attain the desired excitation and mechanical vibration.

In a further embodiment, the layer structure of the transducer comprises a first partial layer structure or a second partial layer structure distanced from the same by a substantially field-free space. Each of the two partial layer structures contains in turn a plurality of electrodes disposed one above the other. The two partial layer structures are disposed next to each other, but at an offset from each other. The two partial layer structures are mechanically decoupled from each other by the introduction of a voltage-free and deformation-free neutral zone between them. As a result, the two partial layer structures, or their electrodes, can be supplied with different control voltages. Preferably, the two adjacent partial layer structures have substantially the same or a symmetrical construction, and in particular, have substantially the same mechanical capacitance equivalence.

The piezoelectric component is characterized by high energy density that is concentrated on a comparatively small space. The capacitance distribution in the piezoelectric component is decisive for the current drawn and the losses. Therefore, when the piezoelectric component vibrates, by recording the dissipation loss of a supplied control voltage, a statement can be made about the damping, and thus, the deviation of the excitation frequency from the natural resonant frequency.

For this purpose, in one embodiment of the method, a control voltage with an excitation frequency for inducing a vibration, preferably a flexural vibration, is applied at least one of the at least two first electrodes and the at least one second electrode. Then a parameter that depends on the generated vibration is recorded. A DC voltage leads to changes of the resonant frequency of the component, whereby with a further simultaneous application of the control voltage having the excitation frequency, the parameter depending on the vibration also changes. This parameter is recorded again, and compared with the previously recorded parameter. The applied DC voltage is changed in response to this comparison.

In this way the natural resonant frequency of the component can be tuned to the excitation frequency by suitable application of a DC voltage. This is performed in several steps, wherein the recorded parameter permits a statement about whether the applied DC voltage for changing the resonant frequency causes a reduction of the damping and with it a change of the resonant frequency in the direction toward the desired resonant frequency. If the excitation frequency and the tuned resonant frequency coincide, the damping has then attained a global minimum.

In one embodiment, the amplitude of the generated vibration or the deflection of the transducer is evaluated. The smaller the deviation between the resonant frequency tuned by the DC voltage and the excitation frequency of the control voltage, the greater the amplitude. Alternatively, the damping of the generated vibration or the temporal progression of the generated vibration can also be evaluated. In the case of a lower damping, the temporal decrease of the amplitude of the generated vibration is correspondingly lower. Correspondingly, the temporal amplitude change can be recorded and evaluated in a further embodiment.

Alternatively, it is also possible to evaluate the power loss from the supplied control voltage. This reaches a minimum when the natural resonant frequency of the component corresponds to the excitation frequency of the control voltage, and with it, to the desired resonant frequency.

It can be expedient to select different offsets between the electrode planes of the transducer, that is, the thickness of the respective piezoelectric layer, in different lateral regions of the body. The largest possible flexural vibrations can be attained in this way. Due to the small electrode offset, with the same arbitrary electrical voltage, the field strength increases in the respective piezoelectric layer. The thickness of the piezoelectric layers can therefore be reduced in such regions of the piezoelectric component, or of a transducer, in which the greatest deviation of the body is sought for achieving a large flexural vibration.

The respective piezoelectric layer is characterized by a polar axis. Piezoelectric layers are preferably disposed with positive and negative polar directions alternating one above the other. For setting a preferential direction of the domain, the piezoelectric layers of the body can be pre-polarized. The polarization field can be 1 kV/mm to 3 kV/mm, for example. In operation, an electric field of up to 200 V/mm per layer can then be attained.

BRIEF DESCRIPTION OF THE DRAWINGS

In the following the invention is explained in detail using various embodiments with reference to the drawings.

FIG. 5 shows a schematic representation of an actuator with two piezoelectric components arranged perpendicular to each other;

FIG. 6 shows a cross-sectional view of a further arrangement of an actuator having two piezoelectric components;

FIG. 7 shows an embodiment of the method for tuning a resonant frequency; and

Figure 1:
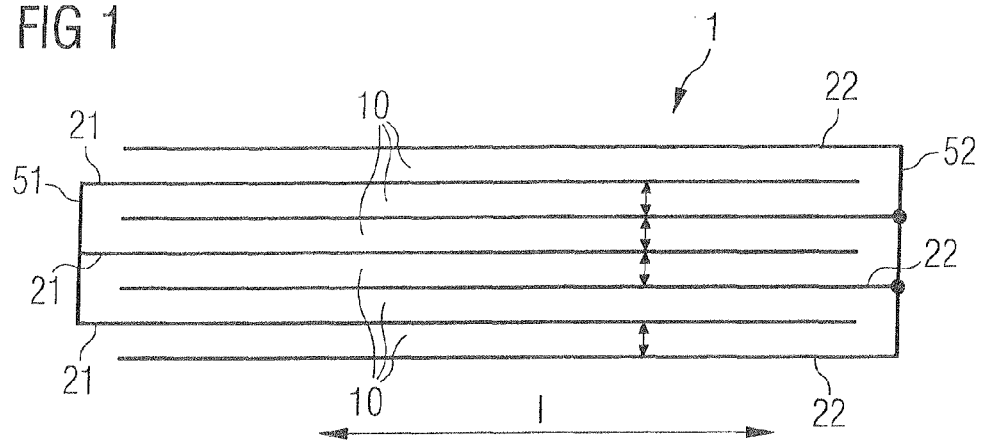
FIG. 1 shows a first embodiment of a piezoelectric component.

The following list of reference symbols may be used in conjunction with the drawings:

1 piezoelectric component
10 piezoelectric layer
11, 12 partial regions
21, 22, 21', 22' electrodes
23, 23', 24, 24' electrodes
51, 52 metallic surface
53, 54 metallic surface
31, 32, 33, 34 contacts
51, 51', 52, 52' metallic surface 53, 54, 53', 54' metallic surface
C1, C2, C3, C4 transducer elements
l length

DETAILED DESCRIPTION OF ILLUSTRATIVE EMBODIMENTS

The individual elements of the embodiments described and represented in the following figures are not drawn to scale. In particular, individual elements can be shown enlarged or reduced for clarity. Individual aspects highlighted only in specific embodiments, for example, layer thickness, offsets or materials can easily be transferred to the other embodiments as well. The term "elastic property" is understood in the following to be a material-dependent elastic parameter. This can be one or more components of an elasticity modulus or a compression modulus, and describes the response of the piezoelectric material to an externally applied field. Conversely, the term elasticity modulus is understood to be an elastic property that describes a mechanical response to an externally applied field. The elastic property can be represented by a tensor, a vector or a scalar. Effectively and functionally equivalent components have the same reference numbers.

The piezoelectric component 1 according to FIG. 1 comprises a transducer that has a plurality of piezoelectric layers 10 and electron planes. These are arranged stacked on top of one another in an alternating sequence. The piezoelectric layers 10 in this embodiment comprise a pre-polarized ceramic material. The piezoelectric component 1 has a plurality of first electrodes 21 and second electrodes 22. These are disposed alternating above one another, each offset from a piezoelectric layer 10. The first electrodes 21 are connected together via a conducting surface 52. A conducting surface 51 correspondingly connects the second electrodes 22 of the transducer.

The natural resonant frequency $f_{res}$ of the piezoelectric component is, among others, dependent on the effective mass $m_{eff}$ of the component, which results from the geometric dimensions, the density $\rho$ of the component, and the material-dependent elasticity modulus S. The latter is a tensor and characterizes the response of the piezoelectric material to a constant electric field strength E. In general, the resonant frequency in the case of a piezoelectric cross or transverse effect, the so-called d31 effect, is at first approximation indirectly proportional to the length. The following applies to the component with the multiple layer structure represented in FIG. 1 and a lateral extension in direction l:

$$f_{res} \propto \frac{1}{2\pi} \cdot \sqrt{\frac{1}{L_m \cdot C_m}}, \quad (1)$$

where Lm represents the mechanical inductivity equivalent and Cm represents the mechanical capacitance equivalent. Because the equivalence depends on the dimension and the material of the component, further in a first approximation the following applies $$f_{res} \propto \frac{1}{l_a} \cdot \sqrt{\frac{1}{\rho \cdot s_{11}} \cdot \frac{V_a}{d \cdot l_a^2 \cdot (4 \cdot l_a \cdot b_{iso} + l_a \cdot b_a)}}, \quad (2)$$

where $l_a$ is the active length of the piezoelectric component, $\rho$ is the density of the component, and $S_{11}$ the corresponding component of the elasticity modulus S. The variable d gives the thickness of the component, and $b_a$ or $b_{iso}$ specifies the active width or width of the isolation layer.

If a DC voltage is now applied to the electrodes 22 or 21, an electric field forms between them that, due to the piezoelectric transverse effect, leads to a change in the length of the component. This is due to the component $S_{11}$, which is not equal to 0. Furthermore, the component $S_{11}$ of the piezoelectric component can also be dependent to a certain degree on the DC voltage. The extension of the piezoelectric component or the elasticity modulus changes due to the applied DC voltage. This results likewise in a shift of the natural resonant frequency $f_{res}$ of the piezoelectric element. At first approximation, equation (2) shows a proportional dependency of the resonant frequency $f_{res}$ on the root of the applied voltage $V_a$.

For tuning the piezoelectric component 1 according to FIG. 1, a DC voltage in the range of a few tens of volts, preferably in the range from −40 V to +50 V, can now be applied to the electrodes 21, 22. This leads to a change of the active length, and with it, a change of the resonant frequency of the component. Thus, by the suitable selection of an applied DC voltage, the resonant frequency can be changed in a desired manner and can be tuned to an excitation frequency of a control voltage also applied to the electrodes.

Figure 2A:
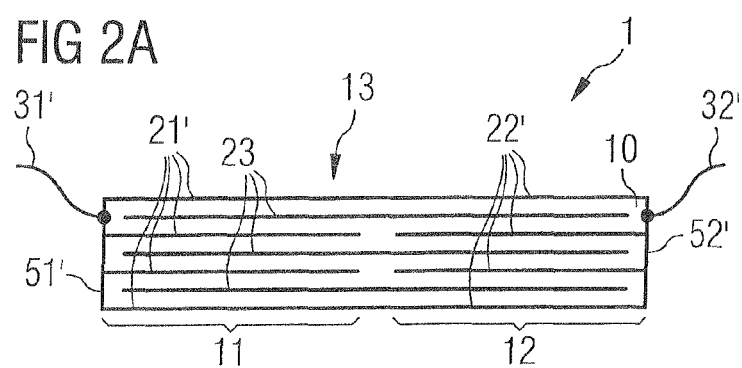
FIG. 2A shows a second embodiment of a piezoelectric component.

FIG. 2A shows a further embodiment of the piezoelectric component 1 with a transducer, which has two partial regions 11 and 12. These are distanced from a neutral region 13 that in the cross-section, according to FIG. 2A, extends in a vertical direction perpendicular to the longitudinal axis of the transducer. The transducer comprises in its first partial region 11 first electrodes 21' that are connected together by means of the first electrically conductive surface 51'. In its second partial region 12 the transducer comprises at least two electrodes 22' that are connected together via the surface 52'. On both surfaces, in each case, contact elements 31', 32' are connected to electrical contacts.

Third electrodes 23 are disposed in each case between the first electrodes 21' in the first partial region and the second electrodes 22' in the second partial region 12. The first electrodes 21' of the first partial region 11 and the second electrodes 22' of the second partial region 12 are each galvanically isolated from the third electrodes 23. The third electrodes run through the neutral region 13 and therefore connect together the two partial regions 11 and 12. In this embodiment, the third electrodes 23 are disposed floating and have no connection to a surface of the component.

Figure 2B:
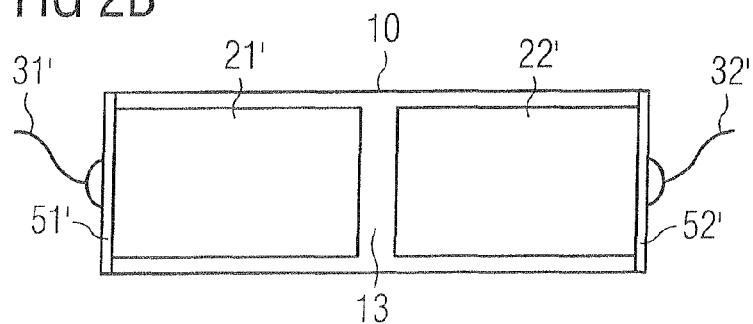
FIG. 2B shows a top view of the piezoelectric component according to FIG. 2A.
Figure 2C:
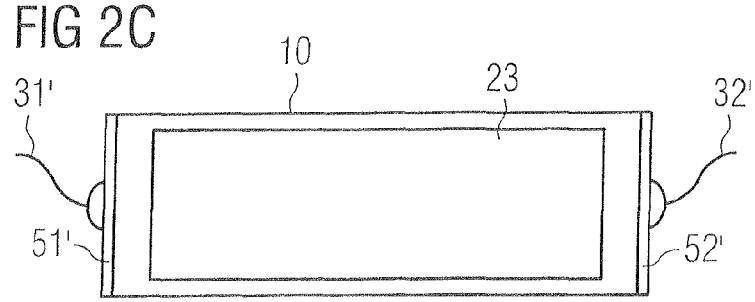
FIG. 2C shows a further top view of the piezoelectric component according to FIG. 2A.

FIG. 2B shows in this regard a top view of the piezoelectric component 1. The two surfaces of the first electrodes 21' and the second electrodes 22' in the individual partial regions 11 and 12 of the transducer can be seen here. The first electrodes 21' are connected to the contact element 31' via the common surface 51'. The surface 52' correspondingly contacts the electrodes 22' of the second partial region. The piezoelectric layer 10 can be seen in the neutral region 13 between the two electrodes 21', 22'. In this regard, FIG. 2C shows a further top view through the piezoelectric component in one plane, in which the third electrode 23 runs. This electrode, designed floating, is galvanically isolated from the transverse surfaces 51' and 52' disposed on both ends and, therefore, from the first and second electrodes.

In operation of the arrangement, the piezoelectric component is excited by a control voltage to vibrate at an excitation frequency. This can be present as flexural vibrations that run perpendicular to the longitudinal axis of the piezoelectric component. Preferably the same control voltage, in particular with the same excitation frequency, is fed to the first electrodes 21' in the first partial region 11 and to the second electrodes 22' in the second partial region 12. If the excitation frequency does not correspond to the natural resonant frequency of the piezoelectric component, damping of greater or lesser strength results here. Thereby, electrical power loss increases and the efficiency of the component is reduced. For tuning the natural resonant frequency to the desired excitation frequency, in one embodiment, a DC voltage is now additionally applied to the first and second electrodes of the two partial regions 11 and 12. This leads to a change of the geometric dimensions, for example an elongation of the piezoelectric component, and possibly to a change of the individual components of the elasticity modulus. The resonant frequency is also shifted accordingly.

Due to the small distances and thicknesses of the piezoelectric layers 10 between the individual electrodes 21 and 22, the field strengths resulting from the DC voltage are very large, so that even with low DC voltages in the range of a few tens of volts, a sufficiently high field strength can be attained for significantly modifying the spatial extension or the elasticity modulus. Tuning is thereby possible even with low DC voltages.

Figure 8:
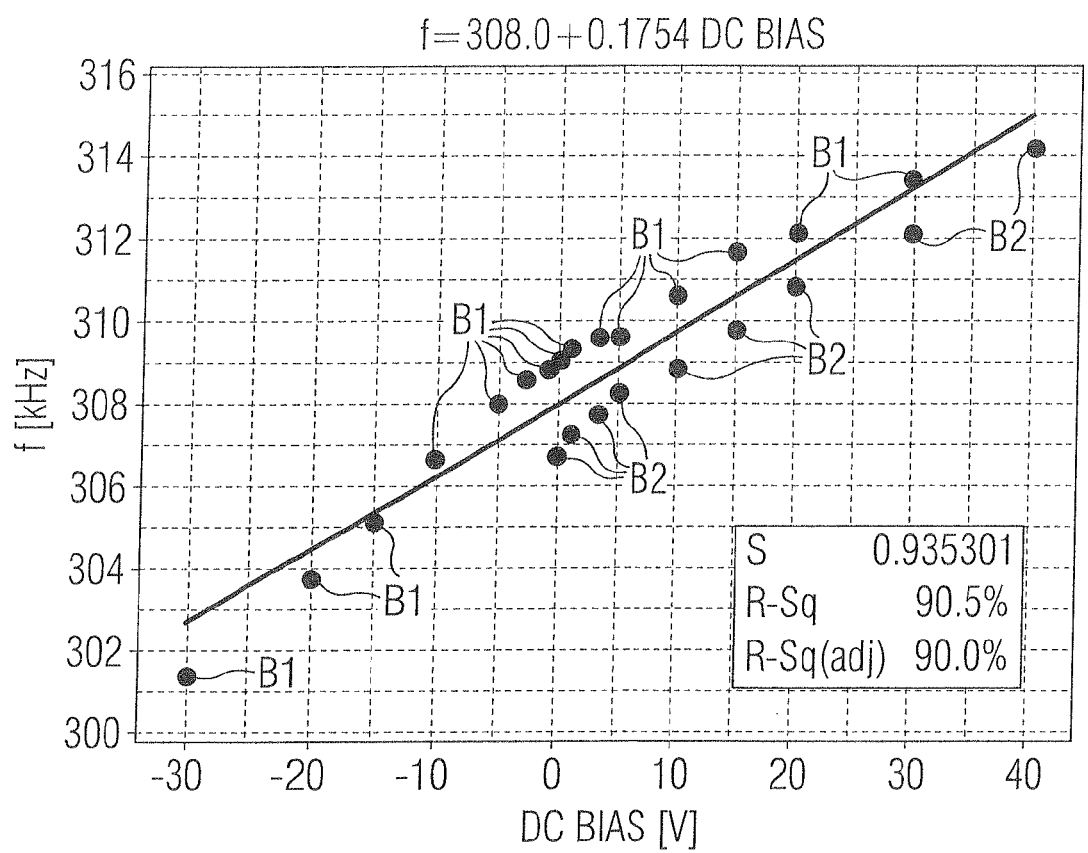
FIG. 8 shows a graph representing the dependency of the resonant frequency on an applied control voltage.

FIG. 8 shows a graph clarifying the relationship between the supplied DC voltage and the change in the resonant frequency. In this embodiment, the two measured piezoelectric components B1, B2 show resonant frequencies in the range of 300 to 316 kHz. As shown, slight variations in the geometric dimensions of different piezoelectric components B1, B2 lead to different natural resonant frequencies. For example, the natural resonant frequencies of the components B1, B2, with no applied DC voltage, fluctuate between 307 kHz 309 kHz.

For tuning or changing the natural resonant frequency, an additional DC voltage is now applied to one or both piezoelectric components. This leads to a substantially proportional change of the resonant frequency, which is represented by the linear fit of FIG. 8. Consequently, a piezoelectric component that, due to its geometric dimensions, has a resonant frequency that differs slightly with respect to its desired excitation frequency, can be tuned to the desired excitation frequency by applying a DC voltage. In addition, different piezoelectric components having slightly differing resonant frequencies can be tuned to a common resonant frequency by applying correspondingly suitable DC voltages.

If, for example, the components B1, B2 are to be tuned to the resonant frequency of 308 kHz, a DC voltage of −5 V is applied to B1 and a DC voltage of +5 V is applied to B2.

Along with the already represented piezoelectric component, additional multilayer arrangements for piezoelectric components are suitable for tuning. In this regard, FIGS. 3A, 3B as well as 4A and 4B show possible configurations.

Figure 3A:
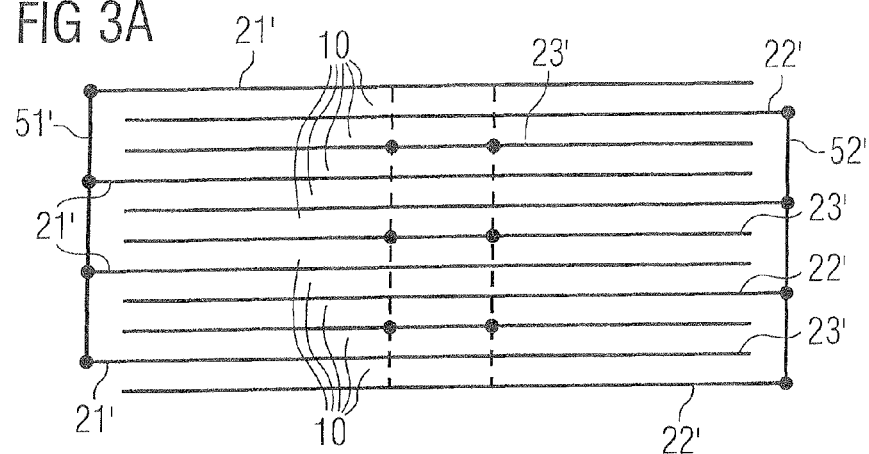
FIG. 3A shows a cross-sectional view of a piezoelectric component according to a further embodiment.
Figure 3B:
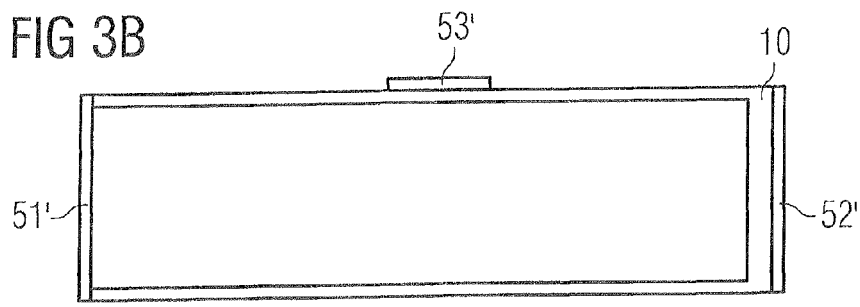
FIG. 3B shows a top view of the piezoelectric component according to FIG. 3A.

In FIG. 3A, three different electrodes are arranged alternating above one another and offset from each other by piezoelectric layers 10 having thicknesses in the range of a few µm. The first electrodes 21' are electrically connected together via a common surface 51', and are galvanically isolated from electrodes 22' and 23' lying between them. Second electrodes 22' are connected together via a second electrically conductive surface 52'. The third electrodes 23' are, as shown in the top view of FIG. 3B, connected to a common surface 53', which is disposed along the longitudinal side of the piezoelectric component. This way, appropriate DC voltages or control voltages can be applied to the different electrodes, in order to attain the desired flexural vibrations, and to correspondingly tune the piezoelectric component. For example, a DC potential or a DC voltage can be applied to surface 51' and an alternating potential or an AC voltage can be applied to surface 52'. The electrodes 23' are connected to a ground potential via the connecting surface 53', and are connected to ground. Naturally, this component can also be subdivided into individual partial regions that can be controlled separately.

Figure 4A:
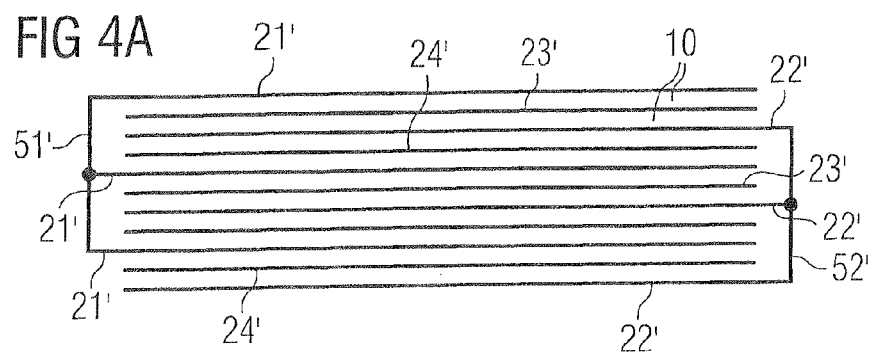
FIG. 4A shows a cross-sectional representation of a further embodiment of a piezoelectric component.
Figure 4B:
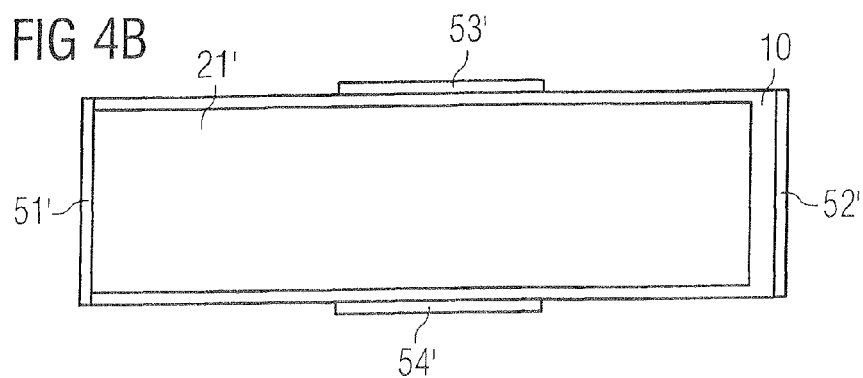
FIG. 4B shows a top view of the piezoelectric component according to FIG. 4A.

FIG. 4A shows a further embodiment that is characterized predominantly by a symmetrical arrangement of the individual electrodes. In this example embodiment, four different electrodes 21' to 24' are arranged alternating above one another. First electrodes 21' and second electrodes 22' are each connected respectively to surfaces 51' and 52' attached to the two ends of the component. Third electrodes 23' are connected to the surface 53', and fourth electrodes 24' are connected to the surface 54'. The two additional surfaces 53' and 54' are, as shown in FIG. 4B, disposed along the longitudinal direction of the component. Alternating voltages and DC voltages can be applied to the different electrodes via the corresponding surfaces 51' to 54'. For example, a control voltage with an excitation frequency can be applied to the surface 51' or 52', while simultaneously a DC voltage is supplied to the component via the surfaces 53' and 54'. Thus, a decoupling of the alternating voltage and DC voltage is possible.

Furthermore, the thicknesses of the different piezoelectric layers 10 between the individual electrodes 21' to 24' can be selected to be different. This permits the greatest possible tuning range to be realized with only low applied DC voltages, with the simultaneous high deflection in a flexural vibration with applied control voltages.

Piezoelectric components according to the proposed principle are used in a plurality of applications, for example, as actuators. Applying a control voltage with an excitation frequency leads the piezoelectric components to vibrate, which can be transferred by a suitable mechanical coupling. Piezoelectric motors, pumps, transformers or membranes can be implemented in this manner.

FIG. 5 shows, in a rough schematic representation, an application as an actuator. In this example embodiment, two piezoelectric components 61 and 62 are disposed at a 90° angle to each other on the element 60 to be excited. The arrangement, shifted by 90°, permits an excitation in two spatial directions. Furthermore, each component comprises two contact elements 63, 66 as well as 65 and 67, at which an alternating voltage or DC voltage can be applied. A force transfer to the element 60 occurs through a fixed mechanical coupling of the two piezoelectric components 61 and 62, for example, through an adhesive. This is designed expediently so that a distortion due to an applied DC voltage is compensated for, and thus decoupled from body 60. Conversely, flexural vibrations caused by an applied control voltage are transferred.

The two piezoelectric components 61 and 62 have a resonant frequency that is equal to the greatest extent possible. Due to low tolerances in the geometric dimensions, however, the natural resonant frequencies of the two piezoelectric components are not completely identical. Thereby, in the case of an excitation at a common excitation frequency, a strong damping in the two components results, whereby overall the efficiency of the arrangement is reduced. For tuning the resonant frequencies of the two piezoelectric components 61 and 62 to each other, suitable DC voltages are now applied to the contacts 63, 66 and also 65 and 67. The DC voltage causes a constant, but also reversible distortion in the piezoelectric components, and thus slightly changes their resonant frequency.

FIG. 6 shows a further embodiment variant in which a membrane 4 is disposed between two identically constructed piezoelectric components. The components 1 and 1' are applied to different sides of the membrane 4 and have similar geometric properties. However, due to component tolerances a slight deviation is present in the geometric dimensions, whereby the resonant frequencies of the two piezoelectric components 1, 1', or of the transducers, are shifted with respect to each other.

The piezoelectric component 1' is constructed in the same manner as the component 1. The latter comprises a first partial region 11 having two conductive transducer elements C1 and C2 disposed above one another. A second partial region 12 likewise contains two conductive transducer elements C3 and C4, disposed above one another and connected together. The thickness of the piezoelectric layers in the regions of the transducer element C1 and C2 of the two partial regions amounts to d1. The transducer elements C3 and C4 have piezoelectric layers with a smaller thickness d2 than the transducer elements C1 and C2. In the embodiment, the transducer elements C1 and C2 are facing the membrane 4.

With the smaller distance d2 between the differently poled electrodes in the region of the body 1 facing away from the membrane 4, it is possible to attain a larger vibration amplitude of the piezoelectric material in the partial regions 11 and 12. A particularly efficient electromechanical transducer is attained due to the change of the distance between the electrodes of the transducer element C3 and C4 of the two partial regions 11 and 12 relative to the transducer element C1 and C2. The two outer surfaces 51 and 52 are in turn led to the outside via appropriate contacting conductors 31 and 32. Furthermore, the common electrodes 23 of the two transducer elements C3 and C4 are led to the surface 53, indicated here with dashed lines, and are electrically conductively connected to the contact 33. A fourth electrode 24 in the elements C1 and C2 of the two partial regions 11 and 12 of the transducer is connected to the surface 54.

In operation, for example, a first control signal $V_1$ with an excitation frequency is applied to the common electrode 24 via the contact surface 54 to the transducer elements C1 and C2. A second control signal $V_2$ with the same or a different excitation frequency for superposition is applied at the common electrodes 23 of the transducer elements C3 and C4 via the contact 33. Further control signals with a DC component can be supplied, preferably, to the common electrodes of the transducer elements disposed above one another. In particular, a control signal $V_3$ is applied to the first electrodes 21 of the transducer elements C1 and C3, and a control signal $V_4$ is applied to the second electrodes 22 of the two transducer elements C2 and C4. Whereas in this embodiment the control signals $V_3$ and $V_4$ represent DC voltage signals and the control signals $V_1$ and $V_2$ contain control voltages with the excitation frequency, in alternative embodiments the respective control signals, depending on the variant, can be reference potentials, DC voltages, control voltages or superimposed signals or combinations thereof.

For tuning the two piezoelectric components 1 and 1', the correspondingly supplied DC voltages $V_3$, $V_4$ are selected so that geometric changes induced by the applied DC voltages align the resonant frequency of the two components with each other. This way, the natural resonant frequencies of the two piezoelectric components are tuned to each other. In order to reduce damping and losses as much as possible, an excitation due to the supplied control voltage preferably occurs at an excitation frequency that corresponds to the tuned resonant frequency.

FIG. 7 shows a schematic representation of a simple method for tuning a resonant frequency of a piezoelectric component. Here, the piezoelectric component, which has a transducer in a multilayer structure, vibrates in a flexural modulus with a natural resonant frequency depending on the geometric parameters and the elasticity modulus. However, due to the component dependent tolerances here, the natural resonant frequency differs slightly from the desired excitation frequency, so that it is expedient to tune the resonant frequencies for improving the excitation and reducing the damping.

In step S1 a piezoelectric component is provided, and next in step S2 a control voltage with an excitation frequency, to which the component should be tuned, is applied to the component. The control voltage forms a temporally changing electric field. Due to this, the component starts to mechanically vibrate. The vibration itself depends on the direction of the field, the geometry, and the elasticity modulus, and is preferably a flexural vibration caused by a change in length generated perpendicular to the electric field. This is also known as the transverse piezoelectric effect. Due to the deviation of the excitation frequency f from the natural resonant frequency, damping of greater or lesser strength occurs. This manifests itself, for example, in lower amplitude and greater damping, but also by greater power loss of the supplied energy.

Then, in step S3 a parameter is recorded from which a measurement is determined for the deviation. This can be, for example, the damping, the amplitude of the vibration, the temporal progression, or also the supplied energy, in order to attain a specific vibration amplitude.

Next, in step S4, a DC voltage is applied that leads to a geometric change or to a change of elasticity modulus. As a result, the inner mechanical capacitance equivalence of the component also changes, which in turn leads to a change of the resonant frequency.

In step S5, the applied DC voltage is now overlaid with the control voltage applied already in step S2. The component now begins anew to vibrate at the excitation frequency. Depending on the shift of the resonant frequency due to the applied DC voltage, the deviation of the now changed natural resonant frequency from the excitation frequency also changes. If this deviation becomes smaller, then the damping is reduced to a corresponding degree, or the amplitude of the vibration of the piezoelectric component increases correspondingly. The parameter characterizing the deviation is now recorded again in step S6, and compared to the already recorded value from step S3.

If, in the course of the comparison in step E1, the result is that the change of the DC voltage leads to an improvement, that is, to a smaller deviation of the changed resonant frequency from the excitation frequency, then the DC voltage applied in step S4 is stored temporarily in step S7. Subsequently, the applied DC voltage is changed again. This change occurs in the same direction without changing the polarity of the applied DC voltage, in order to attain a possible further improvement. The method steps S4, S5, and S6 are now repeated as often as needed until the comparison in step E1 no longer yields an improvement.

In this case, it must be checked whether the loop of the steps S4 to S6 was already performed several times. This is checked in step E3.

If the loop has already been performed several times, in step S8, the value is determined for the applied DC voltage with which the best tuning up to now has been achieved, that is, which yields the lowest deviation of the changed natural resonant frequency from the excitation frequency. The method can be ended here.

If in contrast, the comparison in step E1 shows that the deviation of the changed resonant frequency from the excitation frequency increased already when the DC voltage was first applied in step S4, then according to the comparison step E3 the step S8 is omitted, and the method continues with the comparison step E2. This step checks whether a polarization change has already occurred during application of the DC voltage. If this is the case, then it is assumed that the best tuning between the excitation frequency and the natural resonant frequency has already been attained. The method then ends in step S9. If, in contrast, the comparison step E2 shows that as of yet no change in polarization has occurred, the polarization of the applied DC voltage is changed, and the method continues again with step S4.

The method presented in FIG. 7 shows a simple design for tuning a natural resonant frequency of a piezoelectric component to a desired excitation frequency. With the method, the mechanical capacitance equivalence $C_M$ is changed due to the applied DC voltage, whereby a change in the natural resonant frequency of the piezoelectric component also results. This way, the resonant frequency can be coarsely adjusted by machining a piezoelectric component in a multilayered arrangement, without complex mechanical post-processing being necessary. Fine tuning of the natural resonant frequency of the individual component occurs by applying a DC voltage. Thereby, arbitrary arrangements of piezoelectric components with slightly differing resonant frequencies can be tuned to each other. In addition, the influence of external parameters on the piezoelectric components can be compensated for, such as the influence of temperature. The present method is particularly effective in piezoelectric components in a multilayered arrangement, in which a plurality of electrodes is disposed above one another by thin piezoelectric layers. These can be in a range of a few μm, whereby a large deviation is generated even with low DC voltages or control voltages. This permits the production of very small motors, transformers, loudspeakers in an array arrangement with low operating voltages and simultaneously high common efficiency.

What is claimed is:

1. A method for tuning a resonant frequency of a piezoelectric component having a transducer extending in three spatial dimensions, having a resonant frequency dependent on an extension in at least one of the three spatial dimensions and/or on a material dependent elasticity modulus, the transducer having a layered structure with at least four electrodes arranged alternating above one another, wherein the first electrode and the second electrode are connected to first and second surfaces attached to two ends of the component, wherein the third electrode is connected to a third surface, and wherein the fourth electrode is connected to a fourth surface, the third and fourth surfaces being disposed along a longitudinal direction of the component, the method comprising:

applying a DC voltage to two of the four surfaces, so that a change is generated in the resonant frequency due to a change in the extension in the at least one of the spatial directions and in the elasticity modulus; and applying a control voltage, to generate a vibration, at the other two of the four surfaces having an excitation frequency that corresponds substantially to the changed resonant frequency.

2. The method according to claim 1, wherein the applied DC voltage generates an electric field that is substantially perpendicular to change of the extension caused by the electric field in the at least one of the spatial directions.

3. The method according to claim 1, wherein two adjacent electrodes of the layered structure have the same distance from each other.

4. The method according to claim 1, wherein the layered structure of the transducer comprises a first partial layer structure and a second partial layer structure, distanced therefrom by a substantially field-free space.

5. The method according to claim 4, wherein the electrodes of the first and second partial layer structure are disposed in one plane.

6. The method according to claim 1, wherein the transducer comprises a piezoelectric layer disposed between the electrodes and comprising a ceramic having piezoelectric properties.

7. The method according to claim 1, wherein applying a DC voltage comprises:

applying a control voltage with an excitation frequency, for generating the vibration, to at at least one of the two first and the at least one second electrode;

recording a parameter dependent on the generated vibration;

applying the DC voltage for changing the resonant frequency;

applying the control voltage with the excitation frequency;

re-recording the parameter dependent on the vibration; and changing the applied DC voltage in response to a comparison of the recorded parameters.

8. The method according to claim 7, wherein the parameter comprises at least one of the following:

an amplitude of the generated vibration,
a deflection of the transducer,
a damping of the generated vibration,
a temporal progression of the generated vibration,
a temporal amplitude change, and/or
a power loss derived from the supplied control voltage.

9. The method according to claim 1, further comprising recording a changed resonant frequency after applying the DC voltage, the changed resonant frequency being used as an excitation frequency of the applied control voltage.

10. The method according to claim 1, wherein the generated vibration is a flexural modulus having a deflection of the transducer perpendicular to the longitudinal direction of the transducer.

11. The method according to claim 1, wherein thicknesses of different piezoelectric layers between the individual electrodes are different.

* * * * *